United States Patent
Lee et al.

(10) Patent No.: US 9,231,547 B2
(45) Date of Patent: Jan. 5, 2016

(54) FILTER FOR REMOVING NOISE AND METHOD OF MANUFACTURING THE SAME

(71) Applicant: Samsung Electro-Mechanics Co., Ltd., Gyeonggi-do (KR)

(72) Inventors: Sang Moon Lee, Seoul (KR); Sung Kwon Wi, Seoul (KR); Jeong Bok Kwak, Gyeonggi-do (KR); Won Chul Sim, Gyeonggi-do (KR); Young Seuck Yoo, Seoul (KR); Yong Suk Kim, Gyeonggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 288 days.

(21) Appl. No.: 13/714,143

(22) Filed: Dec. 13, 2012

(65) Prior Publication Data

US 2013/0154770 A1  Jun. 20, 2013

(30) Foreign Application Priority Data

Dec. 14, 2011  (KR) .................. 10-2011-0134532

(51) Int. Cl.
| | | |
|---|---|---|
| *H03H 7/01* | (2006.01) | |
| *H03H 3/00* | (2006.01) | |
| *H03H 7/42* | (2006.01) | |
| *H03H 1/00* | (2006.01) | |
| *H01F 17/00* | (2006.01) | |

(52) U.S. Cl.
CPC .......... *H03H 7/0138* (2013.01); *H03H 1/0007* (2013.01); *H03H 3/00* (2013.01); *H01F 17/0013* (2013.01); *H01F 17/0033* (2013.01); *H01F 2017/0066* (2013.01); *H01F 2017/0093* (2013.01); *H03H 7/427* (2013.01); *H03H 2001/0085* (2013.01); *H03H 2001/0092* (2013.01); *Y10T 29/49147* (2015.01)

(58) Field of Classification Search
CPC .......... H03H 7/427; H03H 2001/0085; H03H 1/0007; H03H 7/0138; H03H 3/00; H03H 2001/0092; Y10T 29/49147; H01F 17/0013; H01F 2017/0066; H01F 2017/0093
USPC .......................................... 333/12, 181, 185
See application file for complete search history.

(56) References Cited

U.S. PATENT DOCUMENTS 8,050,045 B2 * 11/2011 Okuzawa et al. ............. 361/763

FOREIGN PATENT DOCUMENTS

| JP | 2010-165964 | 7/2012 |
| KR | 10-2010-0014896 | 2/2012 |

*Primary Examiner* — Benny Lee
*Assistant Examiner* — Rakesh Patel
(74) *Attorney, Agent, or Firm* — McDermott Will & Emery LLP

(57) ABSTRACT

The present invention discloses a filter for removing noise, which includes: a lower magnetic body; an insulating layer disposed on the lower magnetic body and including at least one conductor pattern; input and output stud terminals electrically connected to the conductor pattern for electrical input and output of the conductor pattern; and an upper magnetic body consisting of an inner upper magnetic body including ferrite powder with a size corresponding to the interval between the input and output stud terminals and an outer upper magnetic body including ferrite powder with a size corresponding to the interval between the input and output stud terminals and an outer surface of the lower magnetic body.
According to the present invention, it is possible to implement a coil part with high performance and characteristics by increasing permeability and improving impedance characteristics through simple structure and process.

9 Claims, 9 Drawing Sheets

- PRIOR ART -

- PRIOR ART -

- PRIOR ART -

- PRIOR ART -

- PRIOR ART -

100

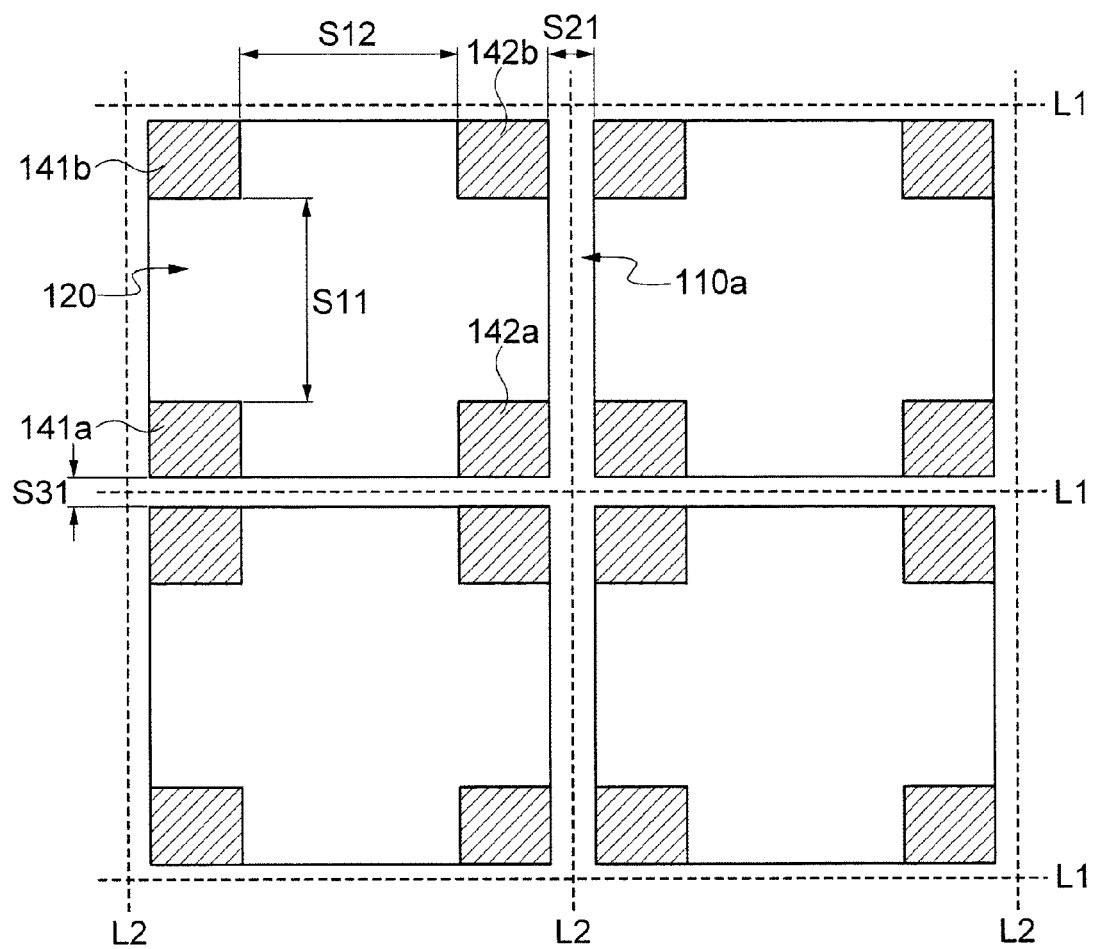

100

DEAERATION  LEVELING  POLISHING

FILTER FOR REMOVING NOISE AND METHOD OF MANUFACTURING THE SAME

CROSS-REFERENCE TO RELATED APPLICATIONS

Claim and incorporate by reference domestic priority application and foreign priority application as follows:

CROSS REFERENCE TO RELATED APPLICATION

This application claims the benefit under 35 U.S.C. Section 119 of Korean Patent Application Serial No. 10-2011-0134532, entitled filed Dec. 14, 2011, which is hereby incorporated by reference in its entirety into this application.

BACKGROUND OF THE INVENTION

1. Field of the Invention

The present invention relates to a filter for removing noise, and more particularly, to a filter for removing noise that is capable of improving performance by increasing permeability and improving impedance characteristics through simple structure and process, and a method of manufacturing the same.

2. Description of the Related Art

Electronic products, such as digital TVs, smart phones, and notebook computers, have functions for data communication in radio-frequency bands. Such IT electronic products are expected to be more widely used since they have multifunctional and complex features by connecting not only one device but also USBs and other communication ports.

Here, for higher-speed data communication, data are communicated through more internal signal lines by moving from MHz frequency bands to GHz radio-frequency bands.

When more data are communicated between a main device and a peripheral device over a GHz radio-frequency band, it is difficult to provide smooth data processing due to signal delay and other noises.

Therefore, there is a need for immunity measures for preventing malfunctions due to external noises as well as preventing electronic products themselves from being noise sources.

In order to solve the above problem, an EMI prevention part is provided around the connection between an IT device and a peripheral device. However, conventional EMI prevention parts are used only in limited regions such as specific portions and large-area substrates since they are coil-type and stack-type and have large chip part sizes and poor electrical characteristics. Therefore, there is a need for EMI prevention parts that are suitable for slim, miniaturized, complex, and multifunctional features of electronic products.

A common-mode filter of EMI prevention coil parts in accordance with the prior art is described below in detail with reference to FIGS. 1 to 3.

Referring to FIGS. 1 to 3, a conventional common-mode filter includes a lower magnetic substrate 10, an insulating layer 20 disposed on the lower magnetic substrate 10 and including a first coil pattern 21 and a second coil pattern 22 which are vertically symmetrical to each other, and an upper magnetic body 30 disposed on the insulating layer 20.

Here, the insulating layer 20 including the first coil pattern 21 and the second coil pattern 22 is formed on the lower magnetic substrate 10 through a thin-film process. An example of the thin-film process is disclosed in Japanese Patent Application Laid-Open No. 8-203737.

And, a first input lead pattern 21a and a first output lead pattern 21b for inputting and outputting electricity to and from the first coil pattern 21 are formed on the insulating layer 20. A second input lead pattern 22a and a second output lead pattern 22b for inputting and outputting electricity to and from the second coil pattern 22 are formed on the insulating layer 20.

In more detail, the insulating layer 20 consists of a first coil layer including the first coil pattern 21 and the first input lead pattern 21a, a second coil layer including the second coil pattern 22 and the second input lead pattern 22a, and a third coil layer including the first output lead pattern 21b and the second output lead pattern 22b.

That is, the first coil layer is formed by coating an insulating material after forming the first coil pattern 21 and the first input lead pattern 21a on an upper surface of the lower magnetic substrate 10 through a thin-film process.

And, the second coil layer is formed by coating an insulating material after forming the second coil pattern 22 corresponding to the first coil pattern 21 and the second input lead pattern 22a on an upper surface of the first coil layer through a thin-film process.

Next, the third coil layer is formed by coating an insulating material after forming the first output lead pattern 21b and the second output lead pattern 22b on an upper surface of the second coil layer through a thin-film process for external output of the first coil pattern 21 and the second coil pattern 22.

At this time, the first coil pattern 21 and the second coil pattern 22 may be electrically connected to the first output lead pattern 21b and the second output lead pattern 22b through via connection structures, respectively.

And, the first input lead pattern 21a is connected to a first input stud terminal 41a, the first output lead pattern 21b is connected to a first output stud terminal 41b corresponding to the first input stud terminal 41a, the second input lead pattern 22a is connected to a second input stud terminal 42a, and the second output lead pattern 22b is connected to a second output stud terminal 42b corresponding to the second input stud terminal 42a.

Although not shown in detail, the first coil layer to the third coil layer may be formed in a sheet shape and combined in a stack-type to configure the above-described insulating layer including the first and second coil patterns, the first and second input lead patterns, and the first and second output lead patterns.

Meanwhile, in the conventional common-mode filter configured as above, in order to improve adhesion and insulation with the insulating layer 20 and withstand voltage characteristics, the upper magnetic body 30 is formed by filling a composite material in which a resin as a binder is mixed in ferrite. In this case, permeability of the common-mode filter is remarkably reduced by the resin constituting the upper magnetic body 30, thus causing deterioration of performance and characteristics of the common-mode filter.

When a particle size of the ferrite constituting the upper magnetic body 30 is increased to increase permeability, radio-frequency characteristics of the common-mode filter are deteriorated, and when the amount of the resin as a binder of the upper magnetic body 30 is reduced, the adhesion, insulation, and withstand voltage characteristics of the upper magnetic body 30 are deteriorated.

Further, in order to increase permeability, there is a method of providing a high-temperature environment when forming the upper magnetic body 30, but there are problems such as deterioration of workability, increase of equipment for increasing a temperature, and deterioration of reliability of the common-mode filter in the high-temperature environment.

SUMMARY OF THE INVENTION

The present invention has been invented in order to overcome the above-described problems and it is, therefore, an object of the present invention to provide a filter for removing noise that is capable of improving performance and reliability by increasing permeability while maintaining high adhesion, insulation, and withstand voltage characteristics of an upper magnetic body and thus improving impedance characteristics, and a method of manufacturing the same.

It is another object of the present invention to provide a filter for removing noise that is capable of preventing an increase in manufacturing costs accompanied when increasing permeability and improving productivity by increasing permeability through simple structure and process and thus preventing an increase in equipment for improving permeability.

In accordance with one aspect of the present invention to achieve the object, there is provided a filter for removing noise including: a lower magnetic body; an insulating layer disposed on the lower magnetic body and including at least one conductor pattern; input and output stud terminals electrically connected to the conductor pattern for electrical input and output of the conductor pattern; and an upper magnetic body consisting of an inner upper magnetic body including ferrite powder with a size corresponding to the interval between the input and output stud terminals and an outer upper magnetic body including ferrite powder with a size corresponding to the interval between the input and output stud terminals and an outer surface of the lower magnetic body.

The ferrite powder may have a size corresponding to 30 to 50% of the interval.

Meanwhile, when the interval between the input and output stud terminals is 220 to 250 µm, the particle size of the ferrite powder included in the inner upper magnetic body within the interval may be 50 to 100 µm.

And, when the interval between the input and output stud terminals and the outer surface of the lower magnetic body is 60 µm, the particle size of the ferrite powder included in the outer upper magnetic body within the interval may be 20 to 50 µm.

Further, when the interval between the input and output stud terminals and the outer surface of the lower magnetic body is 20 µm, the particle size of the ferrite powder included in the outer upper magnetic body within the interval may be 1 to 20 µm.

The upper magnetic body may be filled through a mask with a hole corresponding to the interval.

Here, the upper magnetic body may be provided through a deaeration process for removing voids inside, a leveling process for stabilization and curing, and a polishing process for surface polishing after being filled.

And, the upper magnetic powder may be made of a resin and a polymer including at least one additive of epoxy and polyimide as well as the ferrite powder.

At this time, the resin and the additive may have a mixing ratio of 9:1 as a weight ratio.

In accordance with another aspect of the present invention to achieve the object, there is provided a method of manufacturing a filter for removing noise including: preparing a lower magnetic panel on which a noise removal filter unit having at least one conductor pattern and input and output stud terminals for electrical input and output of the conductor pattern is arrayed in plural; providing a plurality of upper magnetic bodies including ferrite powder with different sizes according to the interval between the input and output stud terminals; and dicing the plurality of noise removal filter units into single noise removal filter units.

The ferrite powder may have a size corresponding to 30 to 50% of the interval between the input and output stud terminals.

The interval between the input stud terminal of the noise removal filter unit and the output stud terminal of the adjacent noise removal filter unit may be 40 µm, and the particle size of the ferrite powder included in the upper magnetic body within the interval may be 1 to 20 µm.

The interval between the output stud terminal of the noise removal filter unit and the output stud terminal of the adjacent noise removal filter unit may be 120 µm, and the particle size of the ferrite powder included in the upper magnetic body within the interval may be 20 to 50 µm.

The interval between the input stud terminal and the output stud terminal electrically connected to the input stud terminal of each noise removal filter unit may be 250 µm, and the particle size of the ferrite powder included in the upper magnetic body within the interval may be 50 to 100 µm.

The conductor pattern may be provided in plural to be separated from each other, the interval between the input and output stud terminals of one of the plurality of conductor patterns and the input and output stud terminals of the other of the plurality of conductor patterns may be 220 µm, and the particle size of the ferrite powder included in the upper magnetic body within the interval may be 50 to 100 µm.

The step of providing the plurality of upper magnetic bodies may be performed by filling a plurality of composite materials including ferrite powder with different sizes through a mask with a hole corresponding to the interval between the input and output stud terminals.

Meanwhile, the method of manufacturing a filter for removing noise may further include a deaeration step for removing voids inside the plurality of upper magnetic bodies, a leveling step for stabilization and curing of the plurality of upper magnetic bodies, and a polishing step for surface polishing of the plurality of upper magnetic bodies, which are sequentially performed after the step of providing the plurality of upper magnetic bodies.

The plurality of upper magnetic bodies may be made of a resin and a polymer including at least one additive of epoxy and polyimide as well as the ferrite powder with different sizes.

At this time, the resin and the additive may have a mixing ratio of 9:1 as a weight ratio.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 6a to 8 are process diagrams schematically showing an embodiment of a method of manufacturing a filter for removing noise in accordance with the present invention, wherein FIG. 6a is a cross-sectional view schematically showing a state in which a plurality of noise removal filter units are arrayed on a magnetic panel, FIG. 6b is a plan view of FIG. 6a, FIG. 7 is a cross-sectional view schematically showing a state in which a plurality of upper magnetic bodies are provided in the state of FIG. 6a, and FIG. 8 is a cross-sectional view schematically showing a single noise removal filter unit obtained by performing a dicing process in the state of FIG. 7.

DETAILED DESCRIPTION OF THE PREFERABLE EMBODIMENTS

Figure 1:
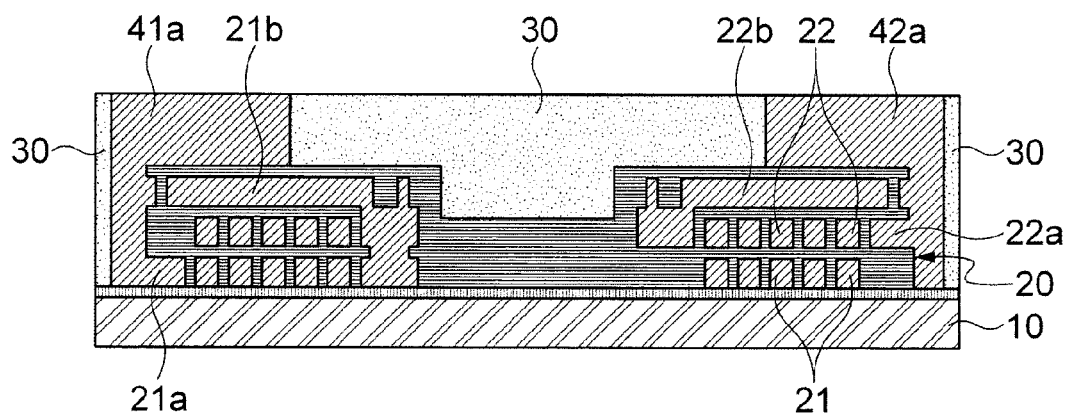
FIG. 1 is a cross-sectional view schematically showing a common-mode filter of conventional filters for removing noise.
Figure 2A:
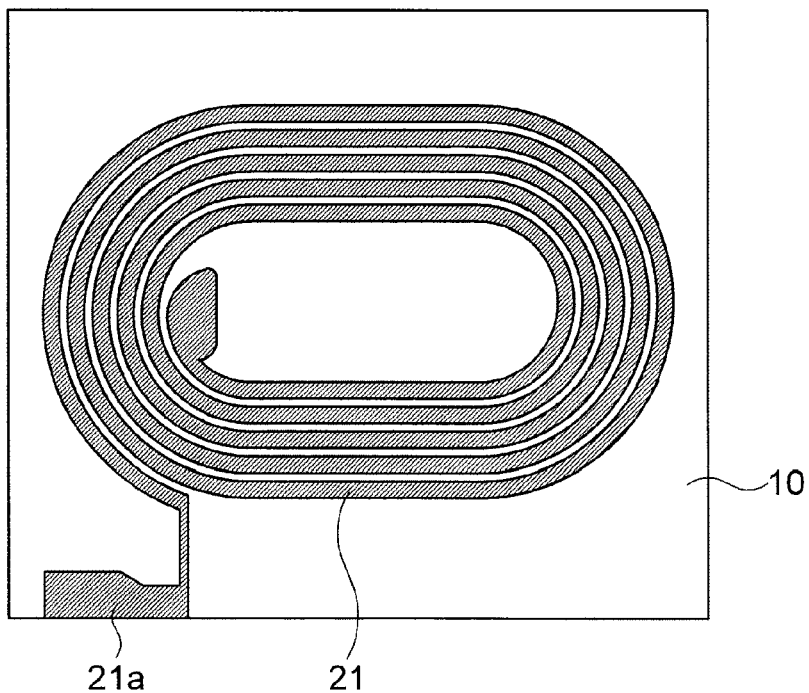
FIG. 2a is a plan view schematically showing a primary coil pattern of FIG. 1.
Figure 2B:
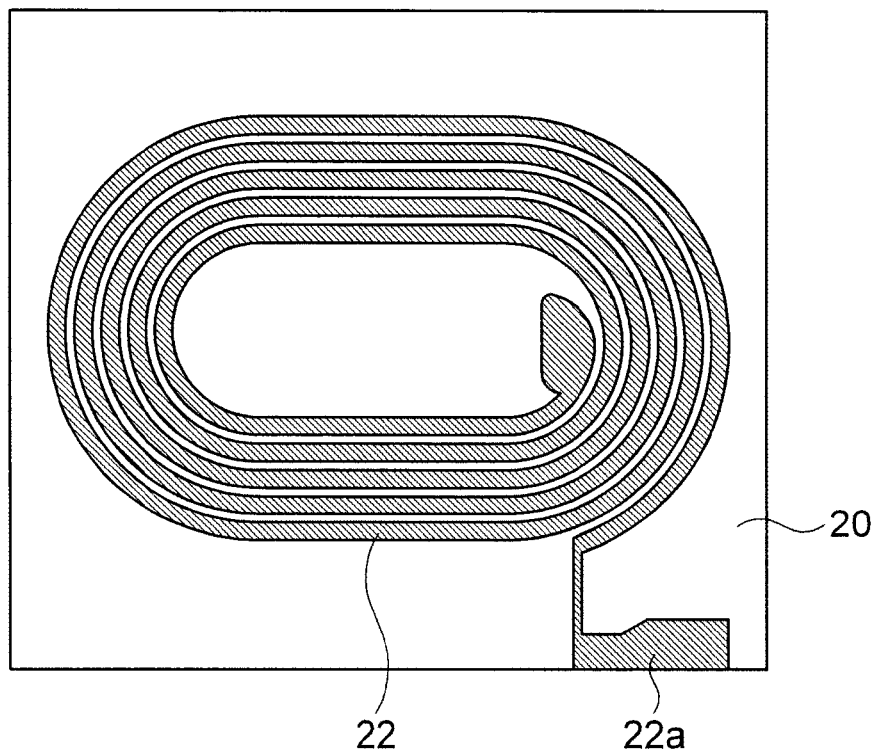
FIG. 2b is a plan view schematically showing a secondary coil pattern of FIG. 1.
Figure 2C:
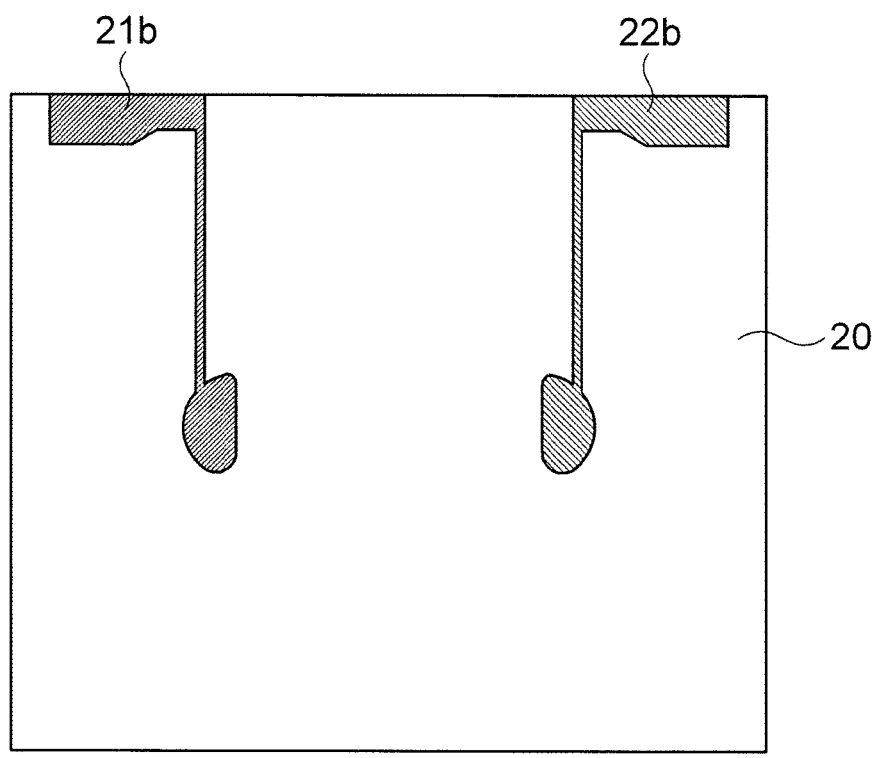
FIG. 2c is a plan view schematically showing an output-side lead pattern of the primary coil pattern of FIG. 2a and an output-side lead pattern of the secondary coil pattern of FIG. 2b.
Figure 3:
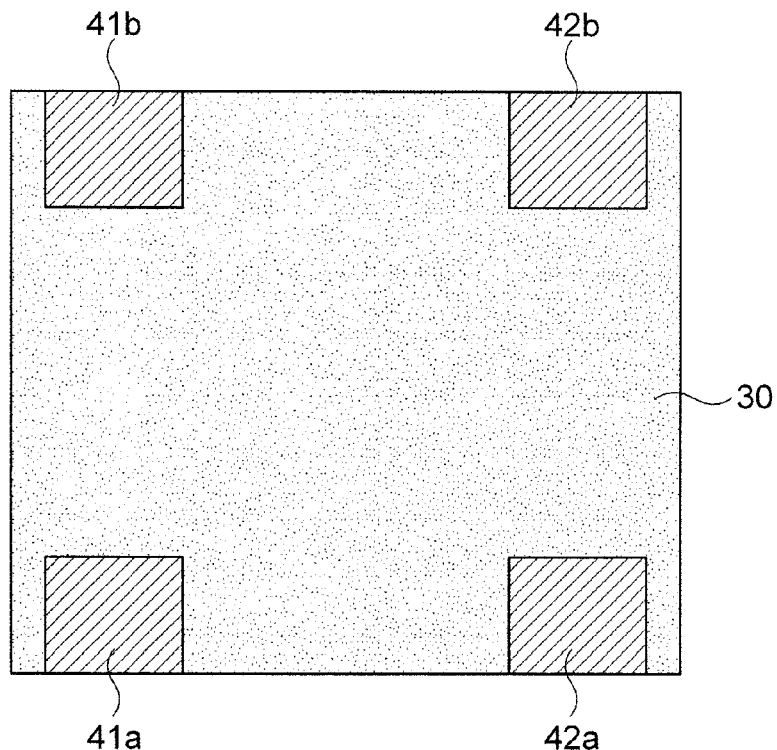
FIG. 3 is a plan view of FIG. 1.

Advantages and features of the present invention and methods of accomplishing the same will be apparent by referring to embodiments described below in detail in connection with the accompanying drawings. However, the present invention is not limited to the embodiments disclosed below and may be implemented in various different forms. The exemplary embodiments are provided only for completing the disclosure of the present invention and for fully representing the scope of the present invention to those skilled in the art. Like reference numerals refer to like elements throughout the specification.

Terms used herein are provided to explain embodiments, not limiting the present invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

Further, embodiments to be described throughout the specification will be described with reference to cross-sectional views and/or plan views, which are ideal exemplary drawings of the present invention. In the drawings, the thicknesses of layers and regions may be exaggerated for the effective explanation of technical contents. Therefore, the exemplary drawings may be modified by manufacturing techniques and/or tolerances. Therefore, the embodiments of the present invention are not limited to the accompanying drawings, and can include modifications to be generated according to manufacturing processes. For example, an etched region shown at a right angle may be formed in the rounded shape or formed to have a predetermined curvature. Therefore, regions shown in the drawings have schematic characteristics. In addition, the shapes of the regions shown in the drawings exemplify specific shapes of regions in an element, and do not limit the invention.

Hereinafter, an embodiment of a filter for removing noise and a method of manufacturing the same in accordance with the present invention will be described in detail with reference to FIGS. 4 to 9.

Figure 4:
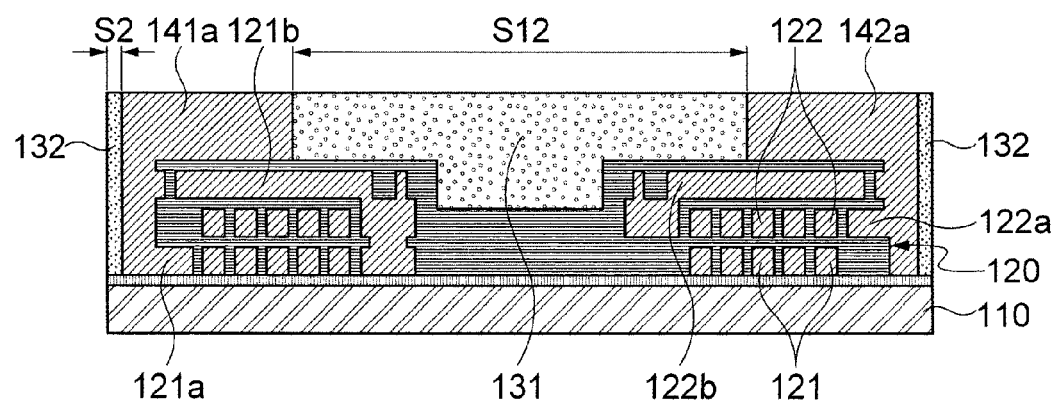
FIG. 4 is a cross-sectional view schematically showing an embodiment of a filter for removing noise in accordance with the present invention.
Figure 5:
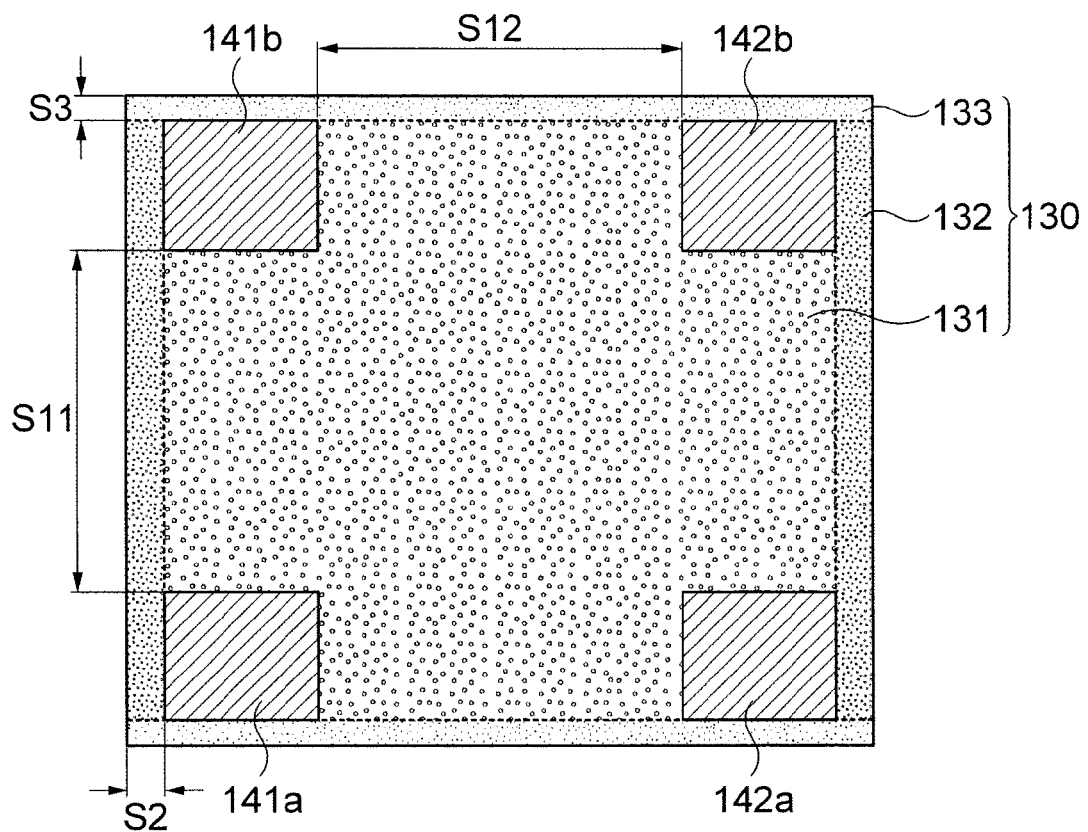
FIG. 5 is a plan view of FIG. 4.

FIG. 4 is a cross-sectional view schematically showing an embodiment of a filter for removing noise in accordance with the present invention, and FIG. 5 is a plan view of FIG. 4.

Figure 6A:
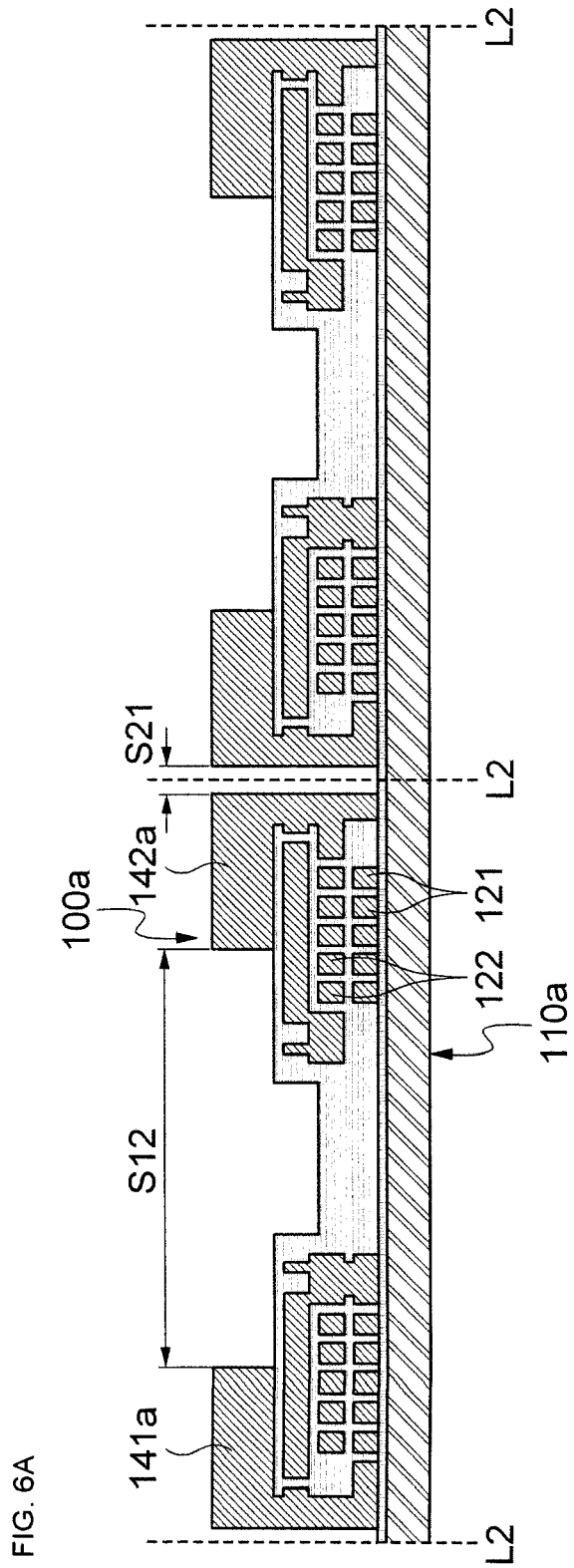
Figure 7:
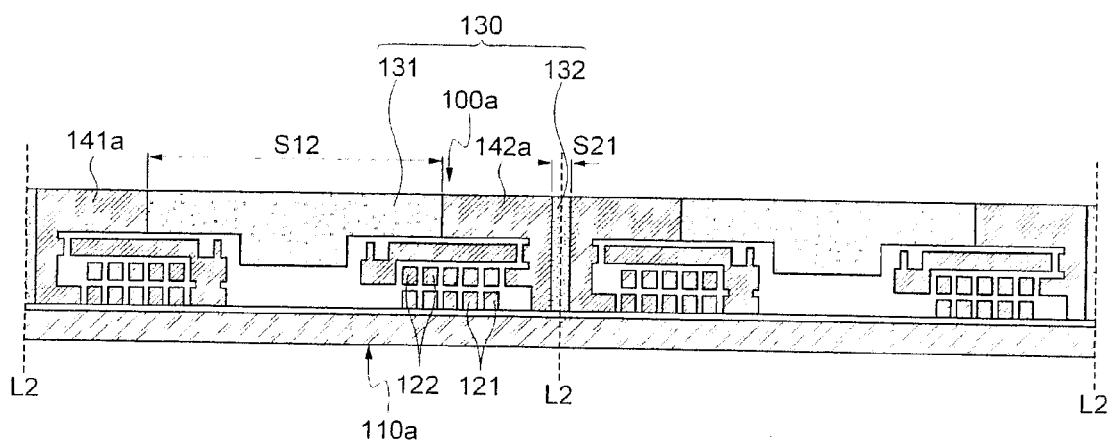
Figure 8:
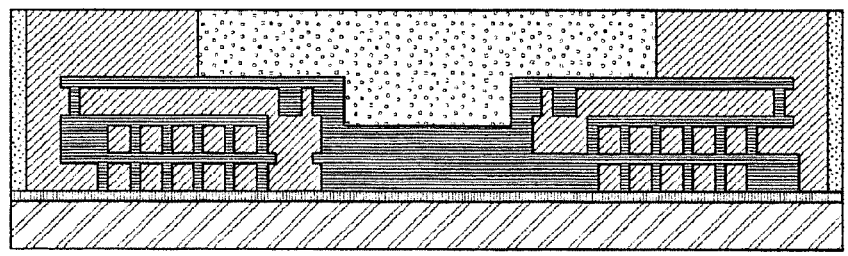

And, FIGS. 6a to 8 are process diagrams schematically showing an embodiment of a method of manufacturing a filter for removing noise in accordance with the present invention, wherein FIG. 6a is a cross-sectional view schematically showing a state in which a plurality of noise removal filter units are arrayed on a magnetic panel, FIG. 6b is a plan view of FIG. 6a, FIG. 7 is a cross-sectional view schematically showing a state in which a plurality of upper magnetic bodies are provided in the state of FIG. 6a, and FIG. 8 is a cross-sectional view schematically showing a single noise removal filter unit obtained by performing a dicing process in the state of FIG. 7.

Figure 9:
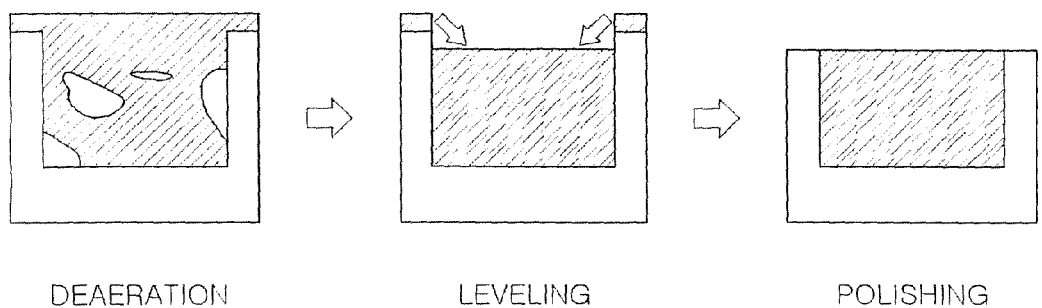
FIG. 9 is a process diagram sequentially schematically showing a deaeration step, a leveling step, and a polishing step of an embodiment of the method of manufacturing a filter for removing noise in accordance with the present invention.

Meanwhile, FIG. 9 is a process diagram sequentially schematically showing a deaeration step, a leveling step, and a polishing step of an embodiment of the method of manufacturing a filter for removing noise in accordance with the present invention.

First, referring to FIGS. 4 and 5, an embodiment 100 of a filter for removing noise in accordance with the present invention may include a lower magnetic body 110, an insulating layer 120 formed on the lower magnetic body 110 and including a primary conductor pattern 121 and a secondary conductor pattern 122, first and second input and output stud terminals 141a, 141b, 142a, and 142b electrically connected to the primary conductor pattern 121 and the secondary conductor pattern 122, and an upper magnetic body 130 formed in a cavity formed by the interval between the first and second input and output stud terminals 141a, 141b, 142a, and 142b and in a cavity formed by the interval between the first and second input and output stud terminals 141a, 141b, 142a, and 142b and an outer surface of the lower magnetic body 110.

The upper magnetic body 130 may include an inner upper magnetic body 131 including ferrite powder with a size corresponding to the interval between the first and second input and output stud terminals 141a, 141b, 142a, and 142b and outer upper magnetic bodies 132 and 133 including ferrite powder with a size corresponding to the interval between the first and second input and output stud terminals 141a, 141b, 142a, and 142b and the outer surface of the lower magnetic body 110.

Here, the outer upper magnetic bodies 132 and 133 may include the left and right outer upper magnetic bodies 132 including ferrite powder with a size corresponding to the interval between the left and right outer surfaces of the first and second input and output stud terminals 141a, 141b, 142a, and 142b and the left and right outer surfaces of the lower magnetic body 131 in the drawing and the front and rear upper magnetic bodies 133 including ferrite powder with a size corresponding to the interval between the front and rear outer surfaces of the first and second input and output stud terminals 141a, 141b, 142a, and 142b and the front and rear outer surfaces of the lower magnetic body 131 in the drawing.

As an example, when the interval S11 between the first and second input and output stud terminals 141a, 141b, 142a, and 142b is about 220 to 250 μm, the particle size of the ferrite powder included in the inner upper magnetic body 131 within the interval S11 may be 50 to 100 μm but not limited thereto. The particle size of the ferrite powder included in the inner upper magnetic body 131 may correspond to 30 to 50% of the interval between the first and second input and output stud terminals 141a, 141b, 142a, and 142b.

And, when the interval S2 between the left and right outer surfaces of the first and second input and output stud terminals 141a, 141b, 142a, and 142b and the left and right outer surfaces of the lower magnetic body 110 is about 60 μm, the particle size of the ferrite powder included in the left and right outer upper magnetic bodies 132 within the interval S2 may be 20 to 50 μm.

Further, when the interval S3 between the front and rear outer surfaces of the first and second input and output stud terminals 141a, 141b, 142a, and 142b and the front and rear outer surfaces of the lower magnetic body 110 is about 20 μm, the particle size of the ferrite powder included in the front and rear outer upper magnetic bodies 133 within the interval S3 may be 1 to 20 μm.

Therefore, according to the filter 100 for removing noise in accordance with this embodiment, it is possible to improve permeability of the filter for removing noise through a simple structure and smoothly fill the upper magnetic body in the corresponding interval by selectively filling a plurality of upper magnetic bodies including ferrite powder with sizes, which correspond to the interval between the first and second input and output stud terminals and the interval between the outer surfaces of the first and second input and output stud terminals and the outer surface of the lower magnetic body, respectively.

Meanwhile, the lower magnetic body 110 may be formed in the shape of a substrate including a ferrite magnetic material.

And, the primary conductor pattern 121 and the secondary conductor pattern 122 may be sequentially formed on the lower magnetic body 110 through a thin-film process and covered with the insulating layer 120 while being electrically isolated from each other.

Here, a first input lead pattern 121a may be formed in an input side of the primary conductor pattern 121, and a first output lead pattern 121b may be formed in an output side of the primary conductor pattern 121. A second input lead pattern 122a may be formed in an input side of the secondary conductor pattern 122, and a second output lead pattern 122b may be formed in an output side of the secondary conductor pattern 122.

At this time, the primary conductor pattern 121 and the secondary conductor pattern 122 may be electrically connected to the first output lead pattern 121b and the second output lead pattern 122b through via connection structures, respectively.

And, the first and second input and output stud terminals 141a, 141b, 142a, and 142b may include the first input stud terminal 141a electrically connected to the first input lead pattern 121a of the primary conductor pattern 121 to input electricity to the primary conductor pattern 121 from the outside, the first output stud terminal 141b electrically connected to the first output lead pattern 121b of the primary conductor pattern 121 to output electricity to the outside, the second input stud terminal 142a electrically connected to the second input lead pattern 122a of the secondary conductor pattern 122 to input electricity to the secondary conductor pattern 122 from the outside, and the second output stud terminal 142b electrically connected to the second output lead pattern 122b of the secondary conductor pattern 122 to output electricity to the outside.

Meanwhile, although not shown in detail, the upper magnetic body 130 may be filled through a mask having holes corresponding to the corresponding intervals.

That is, a plurality of holes corresponding to the inner upper magnetic body 131, the left and right outer upper magnetic bodies 132, and the front and rear outer upper magnetic bodies 133 may be formed in the mask, and the upper magnetic body 130 including the inner upper magnetic body 131, the left and right outer upper magnetic bodies 132, and the front and rear outer upper magnetic bodies 133 may be formed by filling a magnetic material including ferrite powder with different sizes through the plurality of holes.

Here, the upper magnetic body 130 may be formed through a deaeration process for removing voids inside, a leveling process for stabilization and curing, and a polishing process for surface polishing after being filled, and a detailed description thereof will be described in the following method of manufacturing a filter for removing noise in accordance with the present invention.

And, the upper magnetic body 130 may be made of a resin and a polymer including at least one additive of epoxy and polyimide as well as ferrite powder.

That is, the inner upper magnetic body 131, the left and right outer upper magnetic bodies 132, and the front and rear outer upper magnetic bodies 133 may further include a resin for improving adhesion and insulation while including ferrite powder with different sizes and further include at least one additive of epoxy and polyimide for improving other functions.

At this time, the resin and the additive may have a mixing ratio of 9:1 as a weight ratio.

Next, an embodiment of a method of manufacturing a filter for removing noise in accordance with the present invention will be described below in detail with reference to FIGS. 6a to 9.

First, referring to FIGS. 6a and 6b, a lower magnetic panel 110a is prepared, and a noise removal filter unit 100a having a primary conductor pattern 121 and a secondary conductor pattern 122 and first and second input and output stud terminals 141a, 141b, 142a, and 142b for electrical input and output of the respective primary and secondary conductor patterns 121 and 122 is arrayed on the lower magnetic panel 110a in plural.

Next, as shown in FIG. 7, a plurality of upper magnetic bodies 130 including ferrite powder with different sizes according to the interval between the first and second input and output stud terminals 141a, 141b, 142a, and 142b and the interval between the first and second input and output stud terminals 141a, 141b, 142a, and 142b and the first and second input and output stud terminals of the adjacent noise removal filter unit are provided.

Here, when the interval S11 or S12 between the first and second input and output stud terminals 141a, 141b, 142a, and 142b of the noise removal filter unit 100a is about 220 to 250 μm, the particle size of the ferrite powder included in an inner upper magnetic body 131 within the interval S11 or S12 may be 50 to 100 μm but not limited thereto. The particle size of the ferrite powder included in the inner upper magnetic body 131 may correspond to 30 to 50% of the interval between the first and second input and output stud terminals 141a, 141b, 142a, and 142b.

At this time, the interval S11 between the first input stud terminal 141a and the first output stud terminal 141b may be about 250 μm, and the interval S12 between the first output stud terminal 141b and the second output stud terminal 142b may be about 220 μm.

Further, the interval S21 between one of the first and second output stud terminals 141b and 142b of the noise removal filter unit 100a and the output stud terminal of the adjacent noise removal filter unit may be about 120 μm. At this time, the particle size of the ferrite powder included in left and right outer upper magnetic bodies 132 within the interval S21 may be 20 to 50 μm.

Of course, the interval between one of the first and second input stud terminals 141a and 142a of the noise removal filter unit 100a and the input stud terminal of the adjacent noise removal filter unit also may be about 120 μm.

Further, the interval S31 between one of the first and second input stud terminals 141a and 142a of the noise removal filter unit 100a and the output stud terminal of the adjacent noise removal filter unit may be about 40 μm. At this time, the particle size of the ferrite powder included in front and rear outer upper magnetic bodies 133 within the interval S31 may be 1 to 20 μm.

Of course, the interval between one of the first and second output stud terminals 141b and 142b of the noise removal filter unit 100a and the input stud terminal of the adjacent noise removal filter unit also may be about 40 μm.

Meanwhile, referring to FIG. 9, a deaeration process of removing vacuum, that is, voids and solvents included in the filled magnetic material may be performed after filling the upper magnetic body 130.

Next, after the deaeration process, a leveling process of stabilizing and curing the magnetic material by uniformly filling the magnetic material in the entire cavity may be performed.

After that, a polishing process may be performed to remove the over-filled magnetic material and polish a surface.

After completing a manufacturing process of the upper magnetic body 130 as above, as shown in FIG. 8, manufacture of a single filter 100 for removing noise is completed by dicing the plurality of noise removal filter units along dicing lines L1 and L2.

Meanwhile, in the description of the method of manufacturing a filter for removing noise, the same description as the above description of the structure of the filter for removing noise, for example, constituents, a mixing ratio, and mask filling of the upper magnetic body will be omitted.

As described above, according to the filter for removing noise and the method of manufacturing the same in accordance with the present invention, it is possible to improve permeability of a filter for removing noise by selectively injecting upper magnetic bodies including ferrite powder with different sizes according to the interval between input and output stud terminals of the filter for removing noise.

And, according to the filter for removing noise and the method of manufacturing the same in accordance with the present invention, it is possible to improve performance and reliability of a product by implementing high permeability to improve impedance characteristics of a filter for removing noise.

Further, according to the filter for removing noise and the method of manufacturing the same in accordance with the present invention, it is possible to improve productivity and reduce manufacturing costs due to an increase in equipment for improving permeability by improving permeability through simple structure and process.

The foregoing description illustrates the present invention. Additionally, the foregoing description shows and explains only the preferred embodiments of the present invention, but it is to be understood that the present invention is capable of use in various other combinations, modifications, and environments and is capable of changes and modifications within the scope of the inventive concept as expressed herein, commensurate with the above teachings and/or the skill or knowledge of the related art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A filter for removing noise, which comprises:
   a lower magnetic body;
   an insulating layer disposed on the lower magnetic body and including at least one conductor pattern;
   input and output stud terminals electrically connected to the at least one conductor pattern for electrical input and output of the at least one conductor pattern; and
   an upper magnetic body consisting of an inner upper magnetic body and an outer upper magnetic body,
   wherein the inner upper magnetic body includes a first ferrite powder having a particle size within a first interval between the input and output stud terminals, and
   wherein the outer upper magnetic body includes a second ferrite powder having a particle size within a second interval between the input and output stud terminals and an outer surface of lower the magnetic body.

2. The filter for removing noise according to claim 1, wherein the particle size of the first ferrite powder is equal to 30 to 50% of the first interval.

3. The filter for removing noise according to claim 1, wherein when the first interval is 220 to 25 μm, the particle size of the first ferrite powder included the inner upper magnetic body within the first interval is 50 to 100 μm.

4. The filter for removing noise according to claim 1, wherein when the second interval 60 μm, the particle size of the second ferrite powder included in the outer upper magnetic body within the second interval is 20 to 50 μm.

5. The filter for removing noise according to claim 1, wherein when the second interval is 20 μm, the particle size of the second ferrite powder included in the outer upper magnetic body within the second interval is 1 to 20 μm.

6. The filter for removing noise according to claim 1, wherein the upper magnetic body is provided by being filled through a mask with a hole corresponding to the first interval and the second interval.

7. The filter for removing noise according to claim 6, wherein the upper magnetic body is provided through a deaeration process for removing voids inside, a leveling process for stabilization and curing, and a polishing process for surface polishing after being filled.

8. The filter for removing noise according to claim 1, wherein the upper magnetic body is made of any of one of the first ferrite powder or the second ferrite powder, a resin and a polymer, wherein the polymer includes at least one additive of epoxy or polyimide.

9. The filter for removing noise according to claim 8, wherein the resin and the at least one additive have a mixing ratio of 9:1 as a weight ratio.

* * * * *